United States Patent
Ye et al.

(10) Patent No.: US 10,332,741 B2
(45) Date of Patent: Jun. 25, 2019

(54) METHOD FOR POST CHEMICAL MECHANICAL POLISHING CLEAN

(71) Applicant: UNITED MICROELECTRONICS CORP., Hsin-Chu (TW)

(72) Inventors: Yi-Liang Ye, Kaohsiung (TW); Kuang-Hsiu Chen, Tainan (TW); Chun-Wei Yu, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 8 days.

(21) Appl. No.: 15/590,004

(22) Filed: May 8, 2017

(65) Prior Publication Data
US 2018/0323058 A1   Nov. 8, 2018

(51) Int. Cl.
*H01L 21/02* (2006.01)
*H01L 21/66* (2006.01)
*H01L 29/00* (2006.01)
*H01L 21/321* (2006.01)

(52) U.S. Cl.
CPC .. *H01L 21/02074* (2013.01); *H01L 21/02065* (2013.01); *H01L 21/32115* (2013.01); *H01L 22/00* (2013.01); *H01L 29/00* (2013.01)

(58) Field of Classification Search
CPC ......... H01L 21/02052; H01L 21/02065; H01L 21/02074; H01L 21/32115
See application file for complete search history.

(56) References Cited

U.S. PATENT DOCUMENTS 6,455,428 B1 * 9/2002 Tseng ................ H01L 21/31058
257/E21.242

FOREIGN PATENT DOCUMENTS

CN       1546627         11/2004
JP       2013207080 A  * 10/2013

OTHER PUBLICATIONS

Machine translation: JP-2013207080; Ito et al. (Year: 2013).*
Ye, Title of Invention: Method of Fabricating Semiconductor Structure Using Planarization Process and Cleaning Process, U.S. Appl. No. 15/012,821, filed Feb. 1, 2016.

* cited by examiner

*Primary Examiner* — Mikhail Kornakov
*Assistant Examiner* — Natasha N Campbell
(74) *Attorney, Agent, or Firm* — Winston Hsu

(57) ABSTRACT

A method for post chemical mechanical polishing clean is provided in the present invention, which include the steps of providing a substrate, performing a chemical mechanical polishing process, and performing a plurality of cleaning processes sequentially substrate using solutions of sulfuric acid ($H_2SO_4$) and hydrogen peroxide ($H_2O_2$) with different ratios and at different temperatures.

3 Claims, 4 Drawing Sheets

METHOD FOR POST CHEMICAL MECHANICAL POLISHING CLEAN

BACKGROUND OF THE INVENTION

1. Field of the Invention

The present invention relates generally to a method for reducing particulate defects on the surface of semiconductor wafers during the fabrication process. More specifically, the invention relates to a method for particle reduction following the chemical mechanical polishing or planarization (CMP) during wafer fabrication.

2. Description of the Prior Art

Today, chemical mechanical polishing (CMP) is an essential step in the manufacture of almost every modern integrated circuit. As the industry transitions to smaller nodes, it is desirable to remove smaller particles, such as nano sized particles (particles smaller than 100 nm), during post CMP cleaning because the size of defects, such as particles and scratches, in a substrate that can cause yield loss has become smaller and smaller. High number of nano particles may cause metal shorts, and thus, yield loss. Nano particles may also cause topography alternation and impact depth of focus in the subsequent lithography. Additionally, particles may agglomerate and get dislodged from the main surface or the bevel of the substrate and become embedded into the cleaning brush causing yield killing defect excursions.

A primary challenge in wafer fabrication is the continuing reduction of defect levels. Defects or particles potentially present on wafer surfaces include CMP slurry residue, oxides, organic contaminants, mobile ions and metallic impurities. Generally, a "killer defect" (particle) is less than half the size of the device linewidth. For instance, a device using 0.18-micron (µm) linewidth geometry will require that the wafer be substantially free of particles smaller than 0.09 µm, and at 0.13 µm geometry, particles smaller than 0.065 µm. Due to their smaller size, it is physically more difficult to remove smaller particles than larger particles, and nano-sized particles may be more difficult to be removed because they may reattach to the substrate surface due to Van der Waal forces. Thus, it is beneficial to prevent deposition of particles onto the wafers as much as possible and to develop more effective, comprehensive wafer cleaning methods. Accordingly, substrates generally go through a post CMP cleaner where slurry particles and organic residues are removed. Typically, post CMP cleaner consists of several cleaning modules employing various particle removal technologies such as brush clean, high energy scrub clean, megasonic clean, fluid jet and others.

For a variety of reasons, currently available post-CMP wafer clean techniques are less than optimal. The CMP process involves the use of small, abrasive particles slurry that can prove difficult to be removed from the wafer surface. Although the slurry particles serve a valuable role during CMP, they constitute particulate residue defects following the CMP process.

The shortcomings of conventional post-CMP cleaning methods become apparent during post-CMP defect detection, as defect levels are generally higher than desired. It is desired to implement a method for wafer cleaning that simultaneously and effectively removes both slurry residue and organic polymers from wafer surface.

SUMMARY OF THE INVENTION

The problems noted above are solved in large part by a post chemical mechanical polishing cleaning method with varied solution ratios and process temperatures.

The preferred embodiment of the present invention includes the steps of performing a plurality of cleaning processes sequentially on the substrate using solutions of sulfuric acid ($H_2SO_4$) and hydrogen peroxide ($H_2O_2$) at different temperatures after said chemical mechanical polishing process, wherein ratios of $H_2SO_4$ to $H_2O_2$ in the solutions vary gradiently and inversely with said temperatures in different said cleaning processes. With varied cleaning process, both slurries and polymer residue may be most effectively removed.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
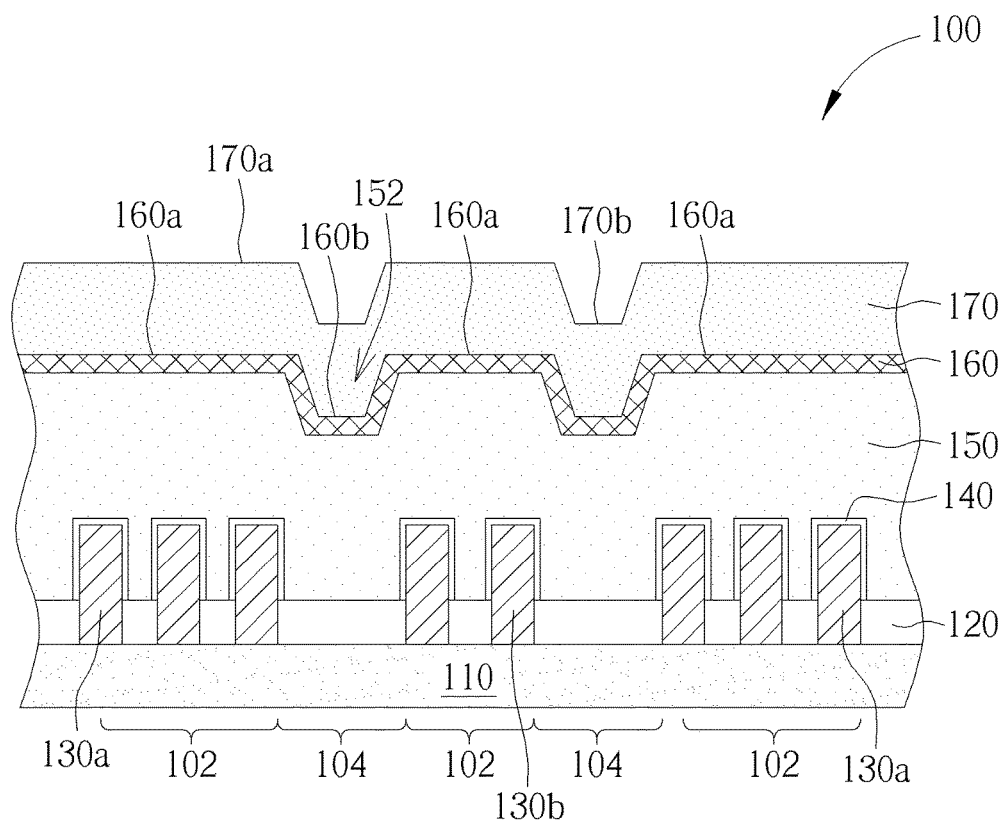
FIG. 1, FIG. 2, FIG. 4, and FIG. 5 are schematic cross-sectional views of an exemplary semiconductor structure with fin-shaped structure at various fabrication stages in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of components and regions may be exaggerated for clarity unless express so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the following paragraphs, the method of fabricating a semiconductor structure using a chemical mechanical polishing (CMP) process and a cleaning process is disclosed in detail.

Figure 2:
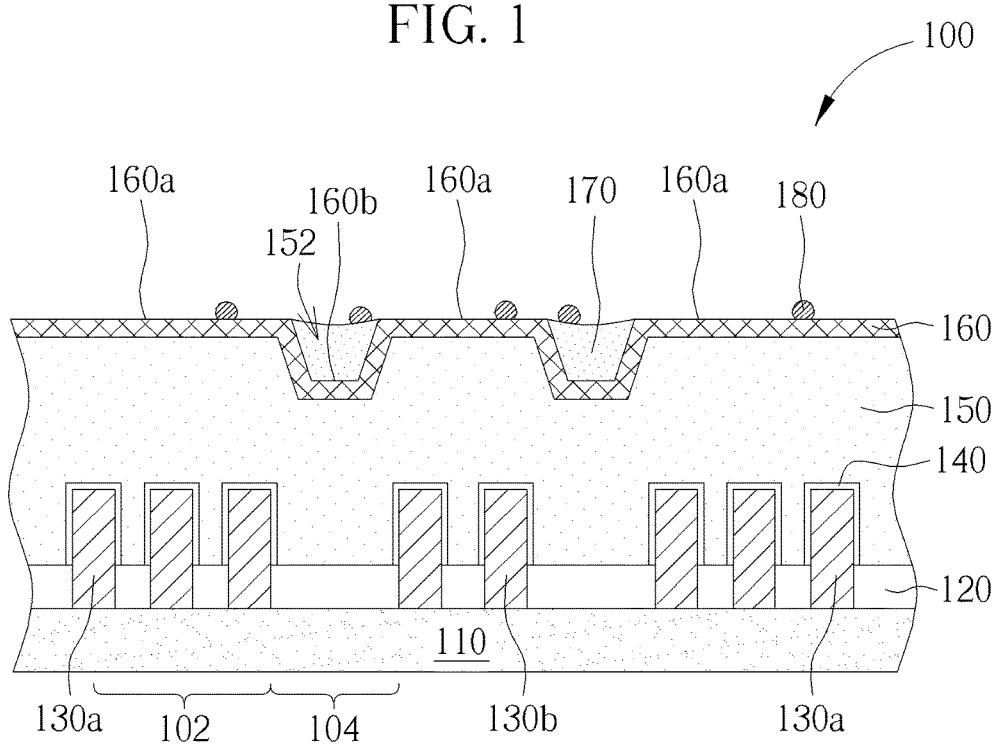

FIG. 1 to FIG. 2 are schematic cross-sectional views of an exemplary semiconductor structure with fin-shaped structure at various fabrication stages in accordance with one embodiment of the present invention. Please refer to FIG. 1 and FIG. 2. In order to obtain the structure 100 shown in FIG. 1, a semiconductor substrate 110 is first provided. Then, a first set of stripe-shaped structures 130a and a second set of stripe-shaped structures 130b may be first fabricated in a first region 102 of a semiconductor substrate 110. The first set of stripe-shaped structures 130a may be spaced apart from the second set of stripe-shaped structure 130b with a space which is defined in a second region 104 of the semiconductor substrate 110. Preferably, the space between the first and second sets of stripe-shaped structures 103a and 130b has a distance greater than spacing between two adjacent stripe-shaped structures 103a and 130b. Afterwards, an isolation structure 120, such as shallow trench isolation (STI), may be fabricated around the lower parts of the stripe-shaped structures 130a and 130b. A thin dielectric layer 140, such as gate dielectric layer, may then be formed on the surface of the stripe-shaped structures 130a and 130b protruding from the isolation structure 120.

In one embodiment of the present invention, the stripe-shaped structures 130a and 130b may be fin-shaped structures made of semiconductor materials which can be configured to be parts of a semiconductor device, such as fin field effect transistor (FinFET), but are not limited thereto. In another embodiment, the stripe-shaped structures 130a and 130b may be parts of interconnections or contact plugs of a semiconductor device. The semiconductor substrate 110 may be chosen from a silicon substrate, III-V semiconductor substrate, or silicon-on-insulator substrate, but is not limited thereto. In addition, the material of the isolation structure 120 is preferably made of silicon oxide ($SiO_2$). Alternatively, this isolation structure 120 could be made of: silicon nitride, silicon oxynitride, similar low dielectric material (preferably having a dielectric constant lower than silicon oxide) or a combination thereof.

After the formation of the stripe-shaped structures 130a and 130b, a first layer 150 is deposited over the first and second sets of stripe-shaped structures 130a and 130b. When the deposition process is completed, a recess 152 may be formed on the surface of the first layer 150 in the second region 104. In one embodiment, the first layer 150 may be made of amorphous silicon (a-Si). Alternatively, the first layer 150 could also be made of polycrystalline silicon, crystalline silicon, SiGe, metal alloy, silicide, or any material suitable for embedding fins. Preferably, the material of first layer 150 should be suitable for making a gate or a dummy gate.

Then, a second layer 160 having a composition different from that of the first layer 150 is conformally formed on the surface of the first layer 150. Since there is a recess 152 on the surface of the first layer 150, some portions of the second layer 160a outside the recess 152 may be higher than the other portions of the second layer 160b in the recess 152. In one embodiment, the second layer 160 is made of silicon nitride. Alternatively, the second layer 160 could be made of: silicon oxynitride (SiON), SiCN, SiOCN, tantalum nitride, titanium nitride, diamond-like carbon, other material properties such that it can be used as a stop layer in the subsequent planarization process or a combination thereof.

Afterwards, a third layer 170 is deposited on the second layer 160. The composition of the third layer 170 may be different from that of the second layer 160. For example, the third layer 170 may be made of silicon oxide, polycrystalline silicon, crystalline silicon, SiGe, metal alloy, silicide, or any suitable material different from the second layer 160. Then, a planarization process, such as CMP process, is carried out to remove the third layer 170 over the second layer 160 until the structure shown in FIG. 2 is obtained.

A typical simplified CMP process may include a substantially circular pad having an abrasive surface that contacts and moves over a wafer polishing pad in a predetermined pattern during wafer polishing. The process involves the immersion of the wafer in an abrasive slurry and polishing of the wafer by a polymeric pad. Through a combination of chemical and mechanical means, the surface of the wafer is smoothed. Typically the polish is performed until a chemical and thermal steady state is achieved and until the wafers have achieved their targeted shape and flatness.

Pad conditioning helps to maintain optimal surface roughness and porosity of the polishing pad, ensuring proper transport of slurry to the surface of wafer as well as the removal of CMP residue. During operation, a pre-selected down force is preferably applied by head to the wafer to achieve a desired polish pressure. More preferably, the slurry particles are comprised of colloidally polydisperse silica ($SiO_2$) or alumina ($Al_2O_3$) particles encapsulated by polymers, depending on the surface to be polished. Some anticorrosive material may be added to the slurry for anti-corrosion, such as benzotriazole (BTA)-based anticorrosive, which has an excellent anticorrosive effect. The action of the down force of head, the respective rotations of polishing head and platen, and the chemical and mechanical effects of slurry cooperate to polish the surface of wafer to a desired planarity and height.

Please refer to FIG. 2, which illustrates an exemplary semiconductor structure with fin-shaped structure after performing a chemical mechanical polishing (CMP) process in accordance with one embodiment of the present invention. When the planarization process is completed, the third layer 170 outside the recess 152 can be removed completely, and some of the third layer 170 may remain in the recess 152. It should be noted that particles 180, such as organic polymer residue and slurry particle may be generated during the planarization process, and some of them may adsorb and remain on the second layer 160 and the third layer 170.

In order to remove the particles 180 remaining on the substrate, a series of post CMP cleaning processes may be carried out. The post CMP cleaner consists of several cleaning modules employing various particle removal technologies such as brush clean, high energy scrub clean, megasonic clean, fluid jet and others. The clean station is configured to remove particles, including but not limited to slurry residue such as silica, alumina or the like, and organic polymer residue from the polishing agent. In some embodiments, the brush bar provides both physical and chemical cleaning to the polished surface of the wafer by including a nozzle for spraying cleaning fluid onto the surface. The nozzle may be connected to a fluid supply for ejecting a fluid. The fluid can be one of many different fluids, including cleaning fluids, de-ionized water, $O_3$, SC1, surfactant, and/or air.

In the embodiment, the cleaning process may be but not limited to a chemical mechanically cleaning (CMC) process on the same polishing pad and platen as the CMP process.

During all of the foregoing processing, the wafer surface remains continuously in contact with the polishing pad. Following the CMC the wafer surface is hydrophilic, so the surface does not immediately dry and residual slurry particles do not adhere to the surface. The wafer can then be dried, for example, in a conventional non-contact dryer such as a spin rinse dry station.

In the present invention, the cleaning process is directed to the use of SPM (mixture of sulfuric acid ($H_2SO_4$) and hydrogen peroxide ($H_2O_2$)) acidic cleaning agent, more specifically, to the SPM acidic cleaning agent with predetermined volume ratios of $H_2SO_4$ and $H_2O_2$ and corresponding elevated process temperatures. Conventionally, sulfuric acid ($H_2SO_4$) and hydrogen peroxide ($H_2O_2$) mixture (SPM) is used for various wet cleaning process of, for example, photoresist stripping, post-resist strip cleaning, residue removal and pre-oxidation cleaning. The volume ratio of $H_2SO_4$:$H_2O_2$ varies, but commonly a mixture by volume between 2:1 to 4:1 of $H_2SO_4$:$H_2O_2$, volume ratios as high as 9:1 have been used. In normal process procedures for preparing SPM batch, the initial ratio is mixed, and then subsequent additions of $H_2O_2$ are added to maintain the ratio.

The temperature of SPM mixture is typically >100° C. to assure complete reaction and to remove any remaining residues. It is important in the post-CMP cleaning, in which too high a temperature can cause rapid decomposition and depletion of the $H_2O_2$, while too low a temperature causes slow removal rates of polymer residue. Mixing of $H_2SO_4$ and $H_2O_2$ creates an exothermic reaction (heat is created) causing the ambient (room or storage) temperature of the solutions to rise, thus the temperature of the SPM mixture in the cleaning process may be partly determined by the volume ratios of $H_2SO_4$ and $H_2O_2$ in the SPM mixture. For example, the temperature of a SPM mixture with a volume ratio 2:1 of $H_2SO_4$ and $H_2O_2$ is spontaneously elevated to 230° C. by the exothermic reaction, while the temperature of a SPM mixture with a volume ratio 9:1 of $H_2SO_4$ and $H_2O_2$ may be spontaneously elevated to only 170° C. by the exothermic reaction since less $H_2O_2$ volume is introduced. The $H_2O_2$ in the SPM decompose rapidly, even without the reaction with polymer residue. The decomposed $H_2O_2$ molecule yields a byproduct of $H_2O$, which dilutes the bath.

In a post CMP cleaning process, hydrogen peroxide is an effective oxidizing agent for the hydrocarbon-based organic polymer from the polishing agent. It is expected that more $H_2O_2$ volume in the solution would benefit the removal of the organic polymer residue. On the other hand, sulfuric acid is dedicated to remove the slurry residue with abrasive silica or alumina particles encapsulated by polymers. It is expected that more $H_2SO_4$ volume in the solution would benefit the removal of slurry residue. In conventional post-CMP cleaning, it is difficult to simultaneously optimize both the removal of polymer and slurry residue since more $H_2SO_4$ volume would dominate the slurry removing, while more $H_2O_2$ volume would dominate the polymer removing. The baseline defect condition could be worse due to the remaining polymer and/or slurry due to the non-optimized and incomplete post-CMP cleaning.

To solve this paradox, the present invention provides a novel post-CMP cleaning process which features the introducing of the SPM mixture with gradient concentrations. This approach is quite distinguished from the conventional post-CMP cleaning process which regularly applies only one SPM mixture with constant volume ratio of $H_2SO_4$ and $H_2O_2$. In the present invention, two or more cleaning steps will be performed sequentially on the substrate using the SPM solutions of $H_2SO_4$ and $H_2O_2$ at different, predetermined temperatures after a chemical mechanical polishing process, wherein volume ratios of $H_2SO_4$ to $H_2O_2$ in the SPM solutions vary gradiently and inversely with temperatures in the different cleaning steps.

Figure 3:
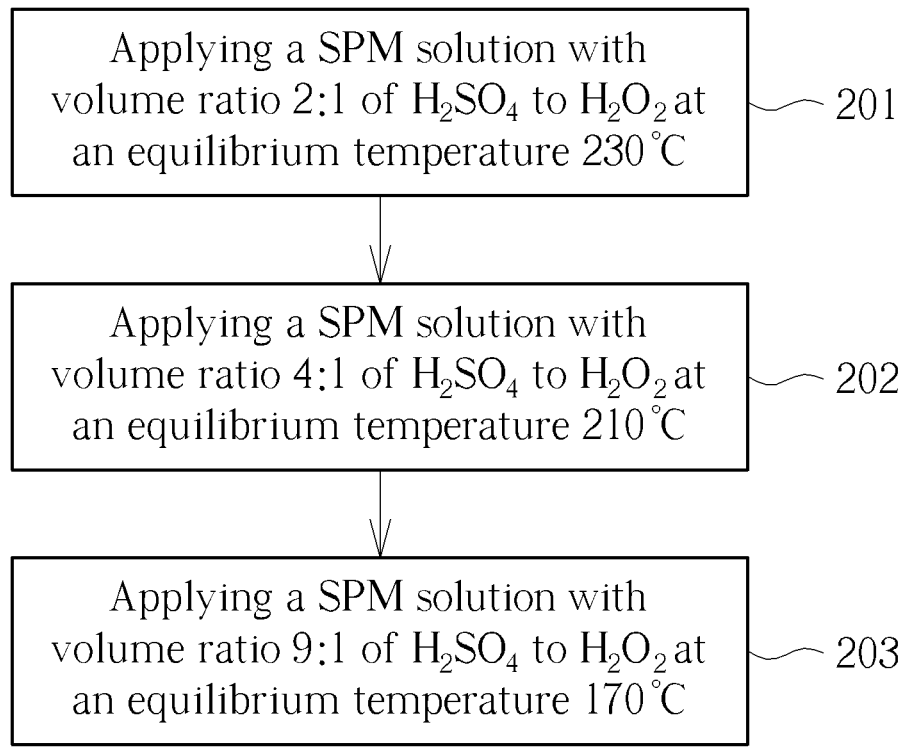
FIG. 3 is a flow chart of the post CMP cleaning processes in accordance with one preferred embodiment of the present invention.

In one preferred embodiment of the present invention, as shown in FIG. 3, three continuous and sequential cleaning steps are applied on a polished surface of the substrate to clean the remaining CMP polymer and slurry. In first cleaning step 201, the SPM solution with volume ratio 2:1 of $H_2SO_4$ to $H_2O_2$ at an equilibrium temperature 230° C. is applied at the polished surface by a nozzle. The first step is dedicated to remove the polymer in the polishing agent by relatively higher temperature to assure complete reaction of $H_2O_2$ component and organic polymer residues. The higher temperature may be achieved spontaneously by higher introduced $H_2O_2$ volume ratio to trigger more exothermic reaction. Alternatively, it may also be achieved by the temperature adjustment of a heater in the CMP tool if needed.

In second cleaning step 202, the SPM solution with volume ratio 4:1 of $H_2SO_4$ to $H_2O_2$ at an equilibrium temperature 210° C. is applied at the same polished surface by the nozzle. The second step is directed to remove the polymer and slurry residues both by appropriate and desired amounts. The temperature of the second cleaning step is lower than the one of the first step due to less introduced $H_2O_2$ volume for conducting the exothermic reaction.

In third and last cleaning step 203, the SPM solution with volume ratio 9:1 of $H_2SO_4$ to $H_2O_2$ at an equilibrium temperature 170° C. is applied at the same polished surface by the nozzle. The third step uses quite high $H_2SO_4$ volume to ensure the removal of remaining Si-based or Al-based slurry particles. The temperature of the third cleaning step is quite lower compared to the ones in the first and second steps since less $H_2O_2$ component is supposed to be depleted during the cleaning step.

Please note that in the present invention, the volume ratios of $H_2SO_4$ to $H_2O_2$ in SPM solutions is preferable to vary gradiently during the cleaning process. It is not recommended to vary the volume ratios of $H_2SO_4$ to $H_2O_2$ abruptly and irregularly to cause a rapid temperature fluctuation in the cleaning process, since it might increase the potential of incomplete removal of the polymer residue. In addition, the number of the cleaning steps with varied volume ratios of $H_2SO_4$ to $H_2O_2$ is not limited to two or three like the one described in the preferred embodiment. It might have multiple continuous SPM cleaning steps with gradient volume ratios to achieve a better, subtle and complete residue removal, depending on the process requirement and the composition of residues.

Figure 4:
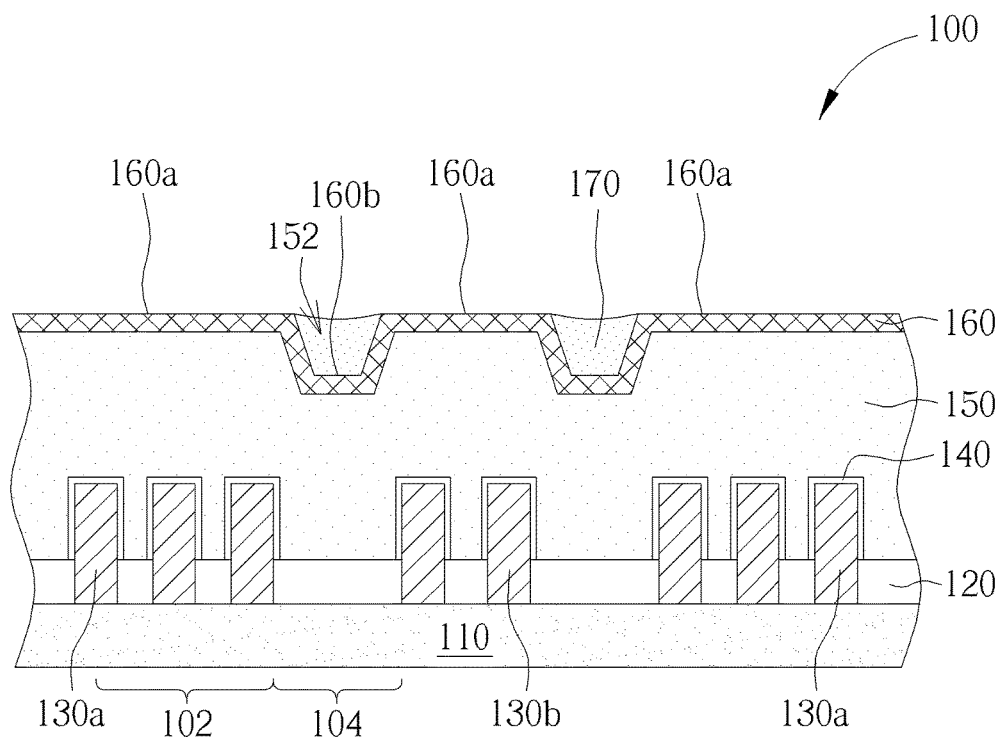

After cleaning and drying, as it is shown in FIG. 4, the particles once remaining on the second layer 160 and the third layer 170 are effectively removed, thus they can no longer impact the subsequent processes. To make sure the particles are completed removed, all of the wafers may be analyzed for light point defects (LPD), a measure of surface defects using laser scanning technology. LPDs having a size greater than 0.13 micrometers (μm) were measured using model SP1 laser scanning equipment available from KLA-Tencor using settings and techniques recommended by the manufacturer. LPDs were found to be reduced by as much as two orders of magnitude in using the CMP method in accordance with the invention in contrast to the conventional method.

Figure 5:
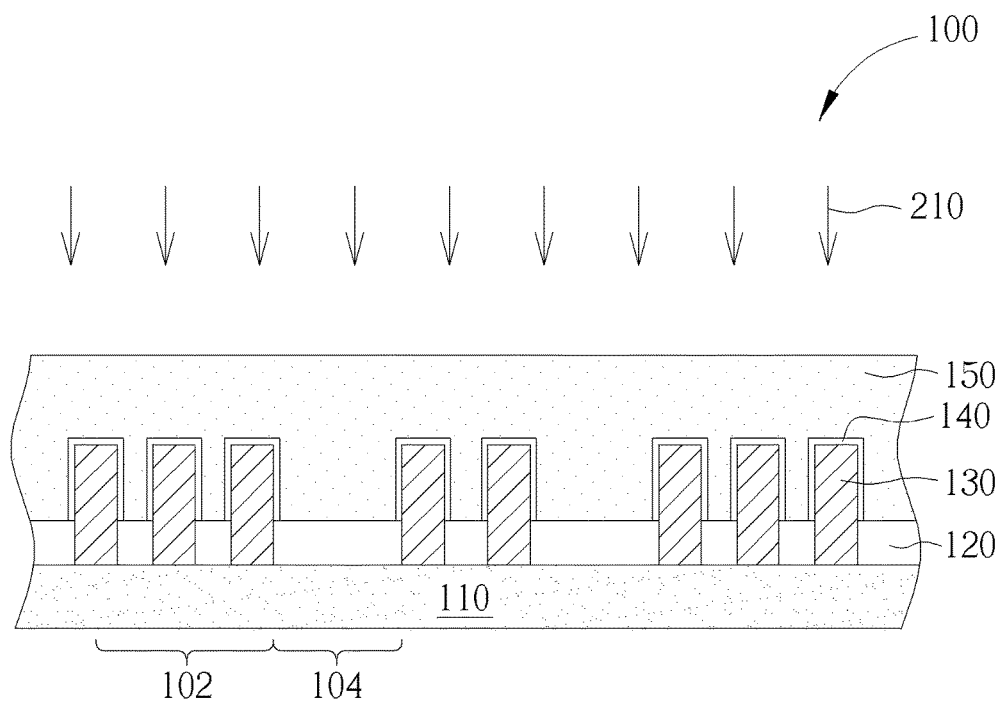

After the cleaning process and the defect analysis is completed, as shown in FIG. 5, the manufacturing process may continue with an etch back process 210 to define the height of the first layer 150. Since the particles 180 are removed completely in the previous cleaning process, the first layer 150 with a flat surface and uniform height can be obtained when the etch back process is completed. The first layer 150 may be patterned in later process to form gate structures across the set of stripe-shaped structures 130.

Figure 6:
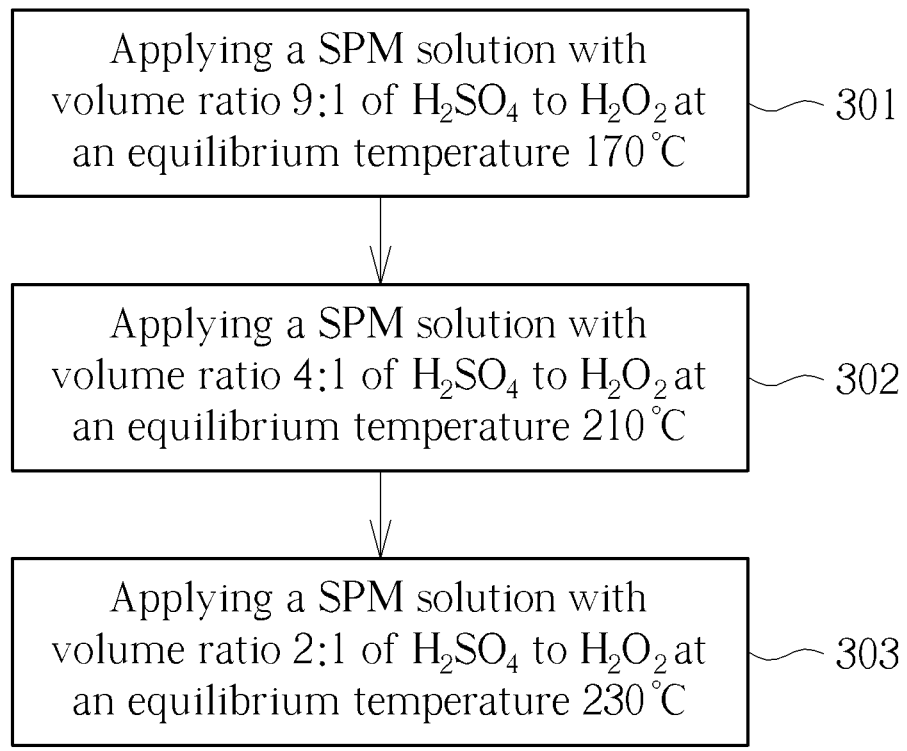
FIG. 6 is a flow chart of the post CMP cleaning processes in accordance with another preferred embodiment of the present invention.

In addition, in other embodiment of the present invention, the volume ratios of $H_2SO_4$ to $H_2O_2$ in the SPM solutions that are applied in the continuous cleaning steps may be decreased gradiently rather than increase gradiently depending on the product and process requirement. As shown in FIG. 6, three continuous and sequential cleaning steps are applied on a polished surface of the substrate to clean the remaining CMP polymer and slurry. In first cleaning step 301, the SPM solution with volume ratio 9:1 of $H_2SO_4$ to $H_2O_2$ at an equilibrium temperature 170° C. is applied at the polished surface by a nozzle. The first step uses quite high $H_2SO_4$ volume to ensure the removal of remaining Si-based or Al-based slurry particles. The temperature of the first cleaning step will be lowest compared to the ones in the subsequent second and third steps since less $H_2O_2$ component is supposed to be depleted during the cleaning step.

In second cleaning step 302, the SPM solution with volume ratio 4:1 of $H_2SO_4$ to $H_2O_2$ at an equilibrium temperature 210° C. is applied at the same polished surface by the nozzle. The second step is directed to remove the polymer and slurry residues both by appropriate and desired amounts. The temperature of the second cleaning step is lower than the one of the first step due to less introduced $H_2O_2$ volume for conducting the exothermic reaction.

In third and last cleaning step 303, the SPM solution with volume ratio 2:1 of $H_2SO_4$ to $H_2O_2$ at an equilibrium temperature 230° C. is applied at the same polished surface by the nozzle. The third step is dedicated to remove the polymer in the polishing agent by relatively higher temperature to assure complete reaction of $H_2O_2$ component and organic polymer residues. The higher temperature may be achieved spontaneously by higher introduced $H_2O_2$ volume ratio to trigger more exothermic reaction. Alternatively, it may also be achieved by the temperature adjustment of a heater in the CMP tool if needed.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for post chemical mechanical polishing clean, comprising:
   providing a substrate;
   performing a chemical mechanical polishing process on said substrate; and
   performing two or more cleaning processes sequentially on said substrate using solutions of sulfuric acid ($H_2SO_4$) and hydrogen peroxide ($H_2O_2$) at different temperatures after said chemical mechanical polishing process, wherein volume ratios of $H_2SO_4$ to $H_2O_2$ in said solutions vary gradiently in different said cleaning processes, and performing said two or more cleaning processes comprises:
   performing a first cleaning process by applying said solutions with volume ratio 9:1 of $H_2SO_4$ to $H_2O_2$ at an equilibrium temperature 170° C.;
   performing a second cleaning process by applying said solutions with volume ratio 4:1 of $H_2SO_4$ to $H_2O_2$ at an equilibrium temperature 210° C.; and
   performing a third cleaning process by applying said solutions with volume ratio 2:1 of $H_2SO_4$ to $H_2O_2$ at an equilibrium temperature 230° C.

2. The method for post chemical mechanical polishing clean of claim 1, wherein the duration of each said cleaning process is the same.

3. The method for post chemical mechanical polishing clean of claim 1, wherein said two or more cleaning processes are performed in the same chamber.

* * * * *